(12) United States Patent
Quittek et al.

(10) Patent No.: US 9,541,585 B2
(45) Date of Patent: Jan. 10, 2017

(54) METHOD AND SYSTEM FOR IDENTIFYING AT LEAST ONE ELECTRICALLY POWERED DEVICE BY A POWER SUPPLY DEVICE VIA A POWERLINE CONNECTION

(75) Inventors: Juergen Quittek, Nussloch (DE); Dominique Dudkowski, Heidelberg (DE); Marcus Brunner, Leimen (DE)

(73) Assignee: NEC Corporation, Tokyo (JP)

( * ) Notice: Subject to any disclaimer, the term of this patent is extended or adjusted under 35 U.S.C. 154(b) by 659 days.

(21) Appl. No.: 13/993,513

(22) PCT Filed: Dec. 15, 2011

(86) PCT No.: PCT/EP2011/072969
§ 371 (c)(1),
(2), (4) Date: Jun. 12, 2013

(87) PCT Pub. No.: WO2012/080423
PCT Pub. Date: Jun. 21, 2012

(65) Prior Publication Data
US 2013/0264889 A1 Oct. 10, 2013

(30) Foreign Application Priority Data
Dec. 15, 2010 (EP) .................................... 10015661

(51) Int. Cl.
*H04B 3/54* (2006.01)
*G01R 21/00* (2006.01)
(Continued)

(52) U.S. Cl.
CPC .............. *G01R 21/00* (2013.01); *G01D 4/002* (2013.01); *H01H 47/00* (2013.01); *H04B 3/54* (2013.01);
(Continued)

(58) Field of Classification Search
CPC .................................. H04B 3/54; Y04S 20/38
See application file for complete search history.

(56) References Cited

U.S. PATENT DOCUMENTS 6,529,883 B1 * 3/2003 Yee ...................... G06Q 20/127
705/400
7,099,934 B1 * 8/2006 Ewing ...................... G06F 1/26
307/11
(Continued)

FOREIGN PATENT DOCUMENTS

FR WO 2009013360 A1 * 1/2009 ........... C07D 271/12
WO 02/21660 A1 3/2002

OTHER PUBLICATIONS

So et al., "Zero-configuration identify-based signcryption scheme for smar card," Oct 4-6, 2010, Smart Grid communications, 2010 First IEEE conference, pp. 321-326.*

(Continued)

*Primary Examiner* — Thienvu Tran
*Assistant Examiner* — Pinping Sun
(74) *Attorney, Agent, or Firm* — Young & Thompson (57) ABSTRACT

A method for identifying at least one electrically powered device by a power supply device via a powerline connection, includes: a) connecting the at least one electrically powered device via a powerline to core power supply; b) sensing that a powerline connection is available by the at least one electrically powered device; c) generating a specific load by modulation of the power according to a unique identifier of the at least one electrically powered device on the powerline connection; d) sensing the generated specific load by the power supply device connected to the powerline connection; and e) extracting the unique identifier information from the specific load by the power supply device. An electrically (Continued)

powered device, a power supply device, a power distribution unit, and a corresponding system are also described.

27 Claims, 4 Drawing Sheets

(51) Int. Cl.
    *G01D 4/00*     (2006.01)
    *H01H 47/00*     (2006.01)

(52) U.S. Cl.
    CPC ............. *Y02B 90/241* (2013.01); *Y02B 90/248* (2013.01); *Y04S 20/32* (2013.01); *Y04S 20/38* (2013.01); *Y04S 20/52* (2013.01); *Y10T 307/826* (2015.04)

(56) References Cited

U.S. PATENT DOCUMENTS

| | | | | |
|---|---|---|---|---|
| 8,028,176 B2* | 9/2011 | Shah | ........................ | H04L 12/10 |
| | | | | 713/300 |
| 8,198,998 B1* | 6/2012 | Propp | ................. | H02J 13/0024 |
| | | | | 340/538 |
| 8,370,701 B2* | 2/2013 | Diab | ..................... | H03M 13/35 |
| | | | | 714/753 |
| 2005/0086337 A1* | 4/2005 | Quittek | ............... | H04L 41/0213 |
| | | | | 709/223 |
| 2005/0099314 A1* | 5/2005 | Aisa | ......................... | H02J 3/14 |
| | | | | 340/637 |
| 2006/0107310 A1* | 5/2006 | Schmid | ................... | H04L 63/08 |
| | | | | 726/4 |
| 2010/0283577 A1* | 11/2010 | Koch | ..................... | G01D 4/002 |
| | | | | 340/5.2 |

OTHER PUBLICATIONS

K-H So H et al: "Zero-Configuration Identity-Based Signcryption Scheme for Smart Grid" Smart Grid Communications (Smartgridcomm), 2010 First IEEE International Conference on, IEEE, Piscataway, NJ, USA, Oct. 4, 2010 (Oct. 4, 2010), pp. 321-326, XP031790245, ISBN: 978-1-4244-6510-1 the whole document.

Anonymous: "IT700 power line communication modem", Internet Citation, Jun. 1, 2008 (Jun. 1, 2008). pp. 1-14, XP002582767, Retrieved from the Internet:URL:http://www.yitran.com/index.aspx?id=33 69 [retrieved on May 18, 2010] the whole document.

International Search Report, dated Apr. 18, 2012, from corresponding PCT application.

* cited by examiner

METHOD AND SYSTEM FOR IDENTIFYING AT LEAST ONE ELECTRICALLY POWERED DEVICE BY A POWER SUPPLY DEVICE VIA A POWERLINE CONNECTION

BACKGROUND OF THE INVENTION

Field of the Invention

The present invention relates to a method for identifying at least one electrically powered device by a power supply device via a powerline connection, preferably for execution with a system.

The present invention also relates to an electrically powered device for identifying with a power supply device, comprising a powerline socket for connecting the electrically powered device via a powerline connection to a core power supply, a core device for performing an intended application of the electrically powered device and an identity sender.

The invention further relates to a power supply device for identifying an electrically powered device, comprising a powerline socket for connecting the power supply device to a powerline, and an identity receiver for receiving a unique identifier of the electrically powered device via the powerline connection.

The present invention also relates to a power distribution unit and to a system for identifying at least one electrically powered device by a power supply device via a powerline connection, preferably for performing a method.

Description of the Related Art

Although the present invention is applicable to various electrically powered devices the present invention will be described in the following with regard to household appliances, entertainment devices, communication devices and their energy management.

The steady increase of energy costs for energy provided, in particular via powerlines for electrically powered devices, requires, in order to partially reduce costs, energy management systems that may monitor and/or control energy consumption of electrically powered devices. Such energy management systems may monitor a potentially large number of electrically powered devices. Every single electrically powered device must therefore be identifiable by the energy management system in order to know precisely which energy consumption of which electrically powered device is actually monitored or measured. Further if the energy management system shall not only monitor but also control each electrically powered device for device management the energy management system must be able to issue control commands to controllers for connecting or disconnecting an electrically powered device from the power supply.

Conventional electrically powered devices, for example household appliances like refrigerators, etc.; entertainment devices, like television; or communication devices, like telephones or the like are not able to communicate that they are associated with a certain energy measuring device or with a controller of an energy management system. The reason is that conventional electrically powered devices are not able to recognize, for example, the electrical socket they are plugged in. To overcome this problem manual intervention is performed, where each new association between an electrically power device and its corresponding measuring device and/or power switch or controller is manually entered into the energy management system and updated whenever necessary. However, this method has certain drawbacks. One of the disadvantages is that manually entering associations will eventually lead to inconsistencies in the set of associations since in large systems the effort to keep up with all the associations is not feasible. This may lead to, for example, a turning off of devices which should not be switched off like devices which are still in use, or to a switching on although the corresponding device is not needed.

BRIEF SUMMARY OF THE INVENTION

It is therefore an objective of the present invention to provide a method, a system, an electrically powered device and a power supply device which are cost effective, enable an automatic identification of an electrically powered device and may be used in systems or clusters ranging from small numbers to high numbers of electrically powered devices.

It is a further objective of the present invention to provide a method, an electrically powered device, a power supply device and a system, which enable a reliable identification of the electrically powered device.

In accordance with the invention the aforementioned objectives are accomplished by the method of the present invention, by the electrically powered device of the present invention, by the power supply device of the present invention and by the system of the present invention.

The method for identifying at least one electrically powered device by a power supply device via a powerline connection, preferably for execution with a system is characterized by the steps of:

a) Connecting the at least one electrically powered device via a powerline connection to a core power supply of the power supply device, b) Sensing that a powerline connection is available by the at least one electrically powered device, c) Generating a specific load by modulation of the power according to a unique identifier of the at least one electrically powered device on the powerline connection, d) Sensing the generated specific load by the power supply device connected via the powerline connection, and e) Extracting the unique identifier information from the specific load by the power supply device.

The electrically powered device for identifying with a power supply device comprises a powerline socket for connecting the electrically powered device via a powerline connection to a core power supply of the power supply device, a core device for performing an intended application of the electrically powered device and an identity sender is characterized in, that the identity sender is formed such to send a unique identifier via the powerline connection, to sense an availability of a powerline connection and to generate a specific load by modulation of the power according to a unique identifier of the electrically powered device on the powerline connection.

The power supply device for identifying an electrically powered device comprises a powerline socket for connecting the power supply device to a powerline and an identity receiver for receiving a unique identifier of the electrically powered device via the powerline connection is characterized in that the identity receiver is formed such to sense a specific load generated by an identity sender of the electrically powered device on the powerline connection and to extract the unique identifier information from the sensed specific load.

The system for identifying at least one electrically powered device by a power supply device via a powerline connection, preferably for performing a method, comprises at least one electrically powered device, at least one power supply device, a measuring device for measuring at least one specific characteristic of the at least one electrically powered device preferably energy consumption using the unique identifier information of the at least one electrically powered device, wherein the at least one electrically powered device, the power supply and the measuring device are connected with each other via at least one powerline.

The power distribution unit comprises a measuring device for measuring at least one specific characteristic of the at least one electrically powered device preferably energy consumption using the unique identifier information of the at least one electrically powered device, a controller for controlling the power supply for the at least one electrically powered device via the powerline connection and a power supply device.

A method and/or a system for controlling energy consumption of household appliances, entertainment devices and/or communication devices is used.

The term power supply device means in particular in the description and in the claims a device comprising at least a core power supply for supplying power and an identity receiver for identifying at least one electrically powered device.

According to the invention it has been first recognized, that generating a specific load by modulation of the power provides a reliable and cost effective way to identify an electrically powered device by a power supply device via a powerline connection. Due to the powerline connection no further data connection between the electrically powered device and power supply device is necessary for identifying the electrically powered device thus saving costs.

According to the invention it has been further first recognized, that an identification of the electrically powered device via a powerline connection provides a reliable identification of the electrically powered device even in large systems with a large number of electrically powered devices each being identified via a powerline connection.

It has further been first recognized, that in contrast to general-purpose powerline communication modules that may serve as identity sender and identity receiver at the same time, such as home plug, Panasonic AV and IEEE 1901, generating a specific load by modulation of the power by a corresponding module in the electrically powered device is cheap and reliable since in contrast to the aforementioned general-purpose powerline communication modules very low bandwidth for identification and therefore much less functionality are required for an identity sender and an identity receiver.

With the invention an electrically powered device and in particular the identity sender may be equipped with the capability to put a unique load pattern on the powerline connection that can be identified by any identity receiver supporting a detection of such pattern. An identification of the electrically powered device does no require a further direct data connection in addition to the powerline connection but only a powerline connection via the same power circuit.

A further advantage is, that the present invention may be used for electrical power in form of alternating current as well as direct current enhancing the number of application areas of the present invention.

According to a preferred embodiment the method comprises the further step f) of registering the at least one electrically powered device with a device management system according to the extracted unique identifier information. One of the advantages is, that an easier and more reliable control of the electrically powered device via the device management system is provided.

According to a further preferred embodiment the method comprises the further step g) of switching on the at least one electrically powered device for normal operation after at least step e). When the electrically powered device is switched on after the steps a) to at least step e) either for example over a remote switch at its powerline connection or by a main power switch of the electrically powered device, only an identity sender gets powered but not yet a core device for normal operation of the electrically powered device. This avoids interference with overall power supplied to the electrically powered device when in normal operation and thus providing enhanced reliability of the identification of the at least one electrically powered device.

According to a further preferred embodiment the time between step a) and step g) is not greater than 2 s, preferably not greater than is, in particular not greater than 500 ms. One of the advantages of these time intervals is, that an optimum of a fast availability of the electrically powered device for normal operation and sufficient reliability of the identification of the electrically powered device is provided.

According to a further preferred embodiment at least one specific characteristic of the at least one electrically powered device, preferably energy consumption, is measured, using a unique identifier information of the at least one electrically powered device. Measuring at least one specific characteristic of the electrically powered device provides an efficient surveillance and management of the electrically powered device, in particular of its energy consumption when for example voltage and electric current provided to the electrically powered device via the powerline connection is measured to determine the energy consumption of the electrically powered device. Of course, other specific characteristics of the electrically powered device may also be measured, for example impedance changes or the like.

According to a further preferred embodiment the device management system is connected to a database and stores the unique identifier information of the at least one electrically powered device in the database. One of the advantages is, that a database provides a reliable storage for the unique identifier information of the electrically powered device. A further advantage is, that the database may be connected to other systems or entities which may also require identification information of the at least one electrically powered device.

According to a further preferred embodiment additional information of the at least one electrically powered device is associated with the unique identifier information. The association may be performed by the device management system receiving the preferably digitally encoded identification of the electrically powered device. The association of additional information may complete a profile for the electrically powered device stored in the database. Additional information may for example be meta-information about the electrically powered device, which may be also downloaded from the internet of a manufacturer of the electrically powered device, previous energy consumption recordings or previous control actions performed on the electrically powered device. The profile of the electrically powered device may then be used for example for analyzing not only energy consumption of the electrically powered device but also for other purposes like usage, maintenance information or the like enhancing the flexibility and monitoring of electrically powered device.

According to a further preferred embodiment the measuring device is associated with the at least one electrically powered device. When the measuring device is associated with the electrically powered device this provides a relation between the measuring device and the at least one electrically powered device and further enables a unique identification which measuring device may be used to measure and/or control of the electrically powered device.

According to a further preferred embodiment a controller for at least controlling the power supply of the at least one electrically powered device via the powerline connection is associated to the electrically powered device. This enables to uniquely identify which controller may be used to control the electrically powered device, thus, providing a more reliable and faster communication for the purpose of control of the at least one electrically powered device in particular by an energy management system. The controller may also be formed such to send and/or receive control signals or control messages to and/or from the at least one electrically powered device, for example via conventional powerline data communication.

According to a further preferred embodiment at least for the step c) and step d) a transmission protocol is used, preferably based on code division multiplexing, frequency division multiplexing and/or error correction codes. A transmission protocol provides an even more reliable identification of the at least one electrically powered device by the power supply device, since for example when using error correction codes for transmission a false extraction of the generated specific load is corrected. A further advantage is, that identification transmissions may be adapted to certain requirements, such as the receiving of multiple identification signals associated with different generated specific loads of different electrically powered devices.

According to a further preferred embodiment error correction and/or false identification detection is used at least in step d) and step e). This further enhances the reliability of identifying the at least one electrically powered device by the power supply device.

According to a further preferred embodiment the specific load is amplified and/or retransmitted. This provides a support for, preferably intermediary, identities or units that serve as relays, forwarders, multiplexers, buffers or the like, for instance power strips or distribution units that are able to replay a certain load pattern. This also provides greater distances in the powerline connection between the electrically powered device and the power supply device via different circuits or via further devices connected to the powerline connection disturbing and/or interfering with the generated specific load. For example, this specific load may additionally be amplified via a forwarder, when the generated specific load at the forwarder is under a certain threshold level.

According to a further preferred embodiment at least one further carrier signal is generated and superimposed on the powerline connection for transmission of further information, preferably related to the electrically powered device. This enables for example also data communication in form of a common powerline communication in particular with the power supply device further enhancing the flexibility of the electrically powered device.

According to a further preferred embodiment of the electrically powered device the electrically powered device further comprising a main power switch to switch on and off the identity sender and/or the core device. A main power switch provides a reliable connection and disconnection of the electrically powered device from the power supply for the electrically powered device and thus saving energy when switched off without causing a standby energy consumption.

According to a further preferred embodiment the identity sender is formed such to control the power supply for the core device. In particular, in connection with a main power switch the identity sender is first switched on by the main power switch and for example with a certain delay the core device is switched on by the identity sender after a successful identification of the electrically powered device via the powerline connection. This avoids interference with the overall power supply to the electrically powered device thus reducing disturbance of the communication with the power supply device further enhancing the reliability of the identification of the electrically powered device by the power supply device.

According to a further preferred embodiment the identity sender is formed such that the specific load is generated by modulation of an impedance, a plurality of impedances and/or pulse width modulation for the power of the powerline connection. This provides different signaling for identifying the electrically powered device by the identity receiver and further leading to enhanced flexibility when adapting the identification of the electrically powered device to a specific environment.

According to a further preferred embodiment the identity sender is formed such to extract information transmitted by the power supply device via the powerline connection. This enables for example the identity sender to receive confirmation information sent by a controller, the power supply or the like. This further enhances the reliability when identifying the electrically powered device by the power supply.

According to a further preferred embodiment of the power supply device the power supply device comprises a confirmation sender for providing at least a confirmation signal for the electrically powered device, preferably via the powerline connection. One of the advantages is, that the power supply device is enabled to provide to the electrically powered device a confirmation that the identification of the electrically powered device was successful. The electrically powered device respectively the identity sender does not have to resend the identity information by generating again a specific load according to a unique identifier of the electrically powered device. In case the switching on of the electrically powered device respectively the core device is delayed until a successful identification of the electrically powered device by the power supply device the electrically powered device may be switched to a normal operational mode in a much faster way.

According to a further preferred embodiment the power supply device further comprises a measuring device for measuring at least one specific characteristic of the electrically powered device, preferably energy consumption, using the unique identifier information of the at least one electrically powered device. Measuring at least one specific characteristic of the electrically powered device provides an efficient surveillance and management of the electrically powered device, in particular of its energy consumption when for example measuring voltage and electric current provided to the electrically powered device via the powerline connection. Of course, other specific characteristics of the electrically powered device may also be measured, for example impedance changes.

According to a further preferred embodiment the power supply device comprises a controller for at least controlling the core power supply the electrically powered device via the powerline connection. This enables to uniquely identify which controller may be used to control the electrically powered device, thus providing a more reliable and faster communication for the purpose of control of the electrically powered device in particular via an energy management system. The controller may also be formed such to send and/or receive control signals or control messages to and/or from the at least one electrically powered device, for example via a conventional powerline data communication.

According to a further preferred embodiment of the system the system further comprises at least one controller for controlling the core power supply of at least one electrically powered device preferably via the powerline connection. This enables to uniquely identify which controller may be used to control the electrically powered device, thus providing a more reliable and faster communication for the purpose of control of the electrically powered device in particular via an energy management system. The controller may also be formed such to send and/or receive control signals or control messages to and/or from the at least one electrically powered device, for example via conventional powerline data communication.

According to a further preferred embodiment the system further comprises a power distribution unit. A power distribution unit enables a connection of a multiple, preferably 8 or 16 electrically powered devices to the same box in form of the power distribution unit. Such a power distribution unit may host both measuring and control functions which can measure for example the energy consumption of each electrically powered device connected thereto and control each electrically powered device individually, for example by turning it on and off by switching the corresponding power supply socket of the electrically powered device connected thereto. In such a case the power supply device may work independently for each power supply circuit of a power distribution unit.

According to a further preferred embodiment the system further comprises a device management system with a database for storing a unique identifier information of at least one electrically powered device in the database and/or for associating the at least one electrically powered device with a unique identifier information and/or for associating the measuring device with at least one electrically powered device. One of the advantages is, that a database provides a reliable storage for the unique identifier information of the electrically powered device. A further advantage is, that the database may be connected to other systems or entities which may also require identification information of the at least one electrically powered device. The association may be performed by the device management system receiving the preferably digitally encoded identification of the electrically powered device. The association of additional information may complete a profile for the electrically powered device stored in the database. Additional information may for example be meta-information about the electrically powered device, which may be also downloaded from the internet of a manufacturer of the electrically powered device, previous energy consumption recordings or previous control actions performed on the electrically powered device. The profile of the electrically powered device may then be used for example for analyzing not only energy consumption of the electrically powered device but also for other purposes like usage, maintenance information or the like enhancing the flexibility and monitoring of electrically powered device. When the measuring device is associated with the electrically powered device this provides a relation between the measuring device and the at least one electrically powered device enableing to uniquely identify which measuring device may be used to measure and/or control of the electrically powered device.

There are several ways how to design and further develop the teaching of the present invention in an advantageous way. To this end it is to be referred to the patent claims on the one hand and to the following explanation of preferred embodiments of the invention by way of example, illustrated by the figure on the other hand. In connection with the explanation of the preferred embodiments of the invention by aid of the figure, generally preferred embodiments and further developments of the teaching will be explained.

DETAILED DESCRIPTION OF THE PREFERRED EMBODIMENTS

Figure 1:
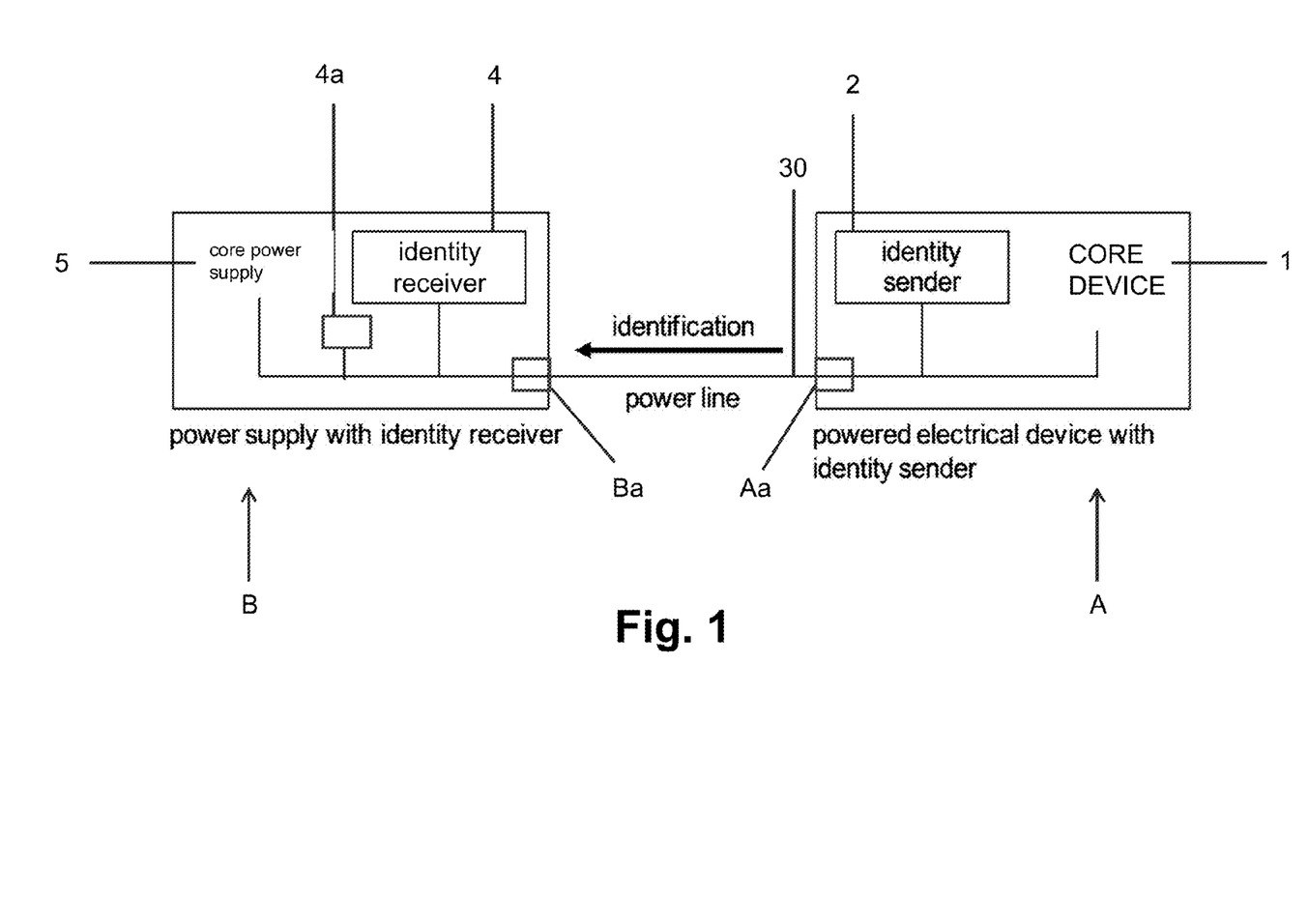
FIG. 1 is showing an electrically powered device and a power supply device according to a first embodiment of the present invention.

FIG. 1 is showing an electrically powered device and a power supply device according to a first embodiment of the present invention.

In FIG. 1 reference sign A denotes an electrically powered device. The electrically powered device A comprises a core device 1 which performs an intended application for the electrically powered device. An intended application may be measuring a temperature, providing a telephone connection, showing a television program, etc. The core device 1 is connected via a powerline connection 30 to an identity sender 2. The identity sender 2 is connected via the powerline connection 30 to a powerline socket Aa for providing electrical power to the electrically powered device. Further the powerline connection 30 is used for identification of the electrically powered device A. The electrically powered device A is further connected via the powerline connection 30 to a power supply device B, comprising an identity receiver 4, core power supply 5 as well as a confirmation sender 4a. The core power supply 5, the confirmation sender 4a and the identity receiver 4 are connected to the powerline connection 30 and in particular via a powerline socket Ba.

When connecting the electrically power device A via the powerline connection 30 the identity sender 2 recognizes that power from the core power supply 5 via the powerline connection 30 is provided to the electrically powered device A. The identity sender 2 is formed such to delay the switching on of the core device 1 until the identification of the electrically powered device A is completed. The identity sender 2 therefore generates a specific load according to unique identifier of the electrically powered device A on the powerline connection 30 which is recognized and received by the identity receiver 4 of the power supply device B. The power supply device B comprises the aforementioned confirmation sender 4a which sends a confirmation signal to the electrically powered device A, preferably via the powerline connection after a successful identification of the electrically powered device A by the identity receiver 4 of the a power supply device B, so that the electrically powered device A recognizes the confirmation signal. The successful identification is completed. After generating the specific load and after successful identification by the specific load of the electrically powered device A by the power supply device B the identity sender 2 in the electrically powered device A switches on the core device 1 for the intended application of the electrically powered device.

Figure 2:
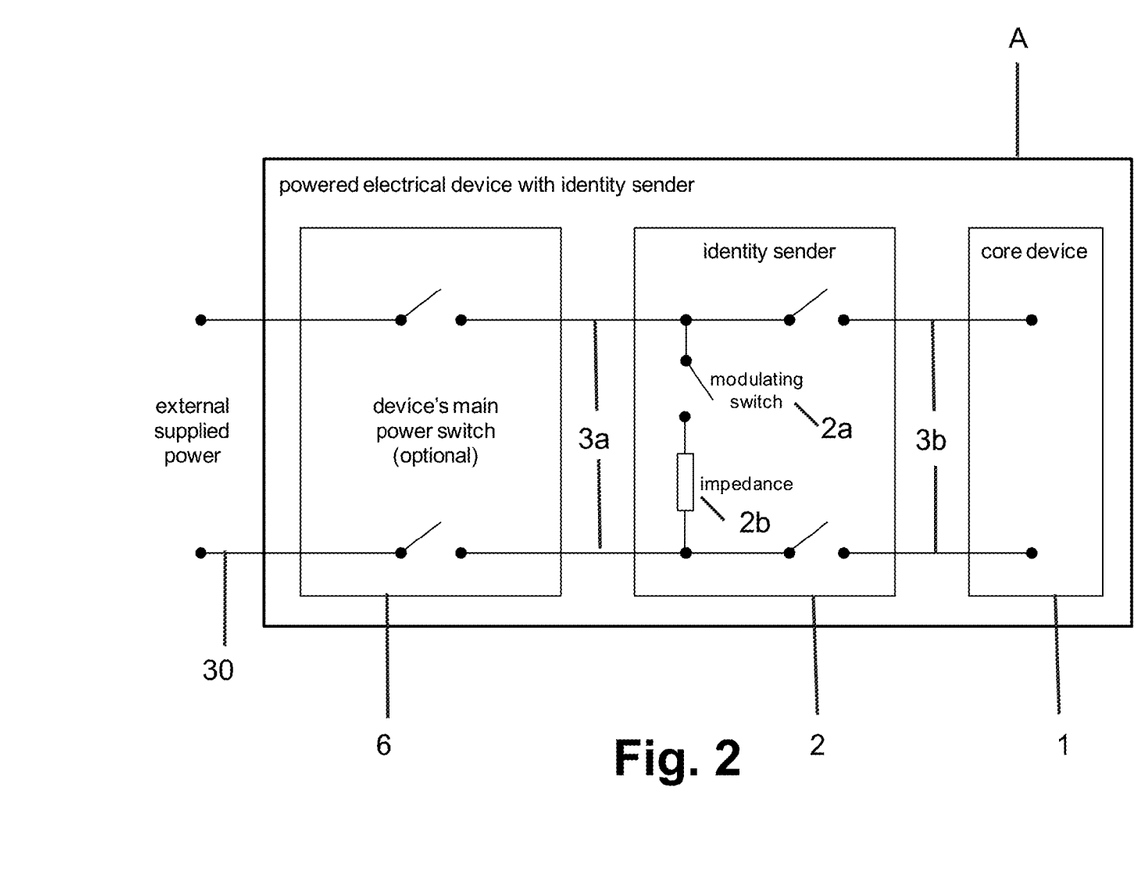
FIG. 2 is showing an electrically powered device according to a second embodiment of the invention.

FIG. 2 is showing an electrically powered device according to a second embodiment of the invention.

In FIG. 2 is shown an electrically powered device A comprising a core device 1, and an identity sender connected to the core device via a powerline connection 3b. The identity sender 2 is connected via a powerline connection 3a to a main power switch 6 of the electrically powered device A. The main power switch 6 is connected via a powerline connection 30 to an external power supply. The identity sender 2 further comprises a modulating switch 2a and an impedance 2b for generating a specific load by a modulation of the impedance on the powerline connection 3a and the powerline connection 30. When the electrically powered device A is powered off, the identity sender 2 as well as the core device 1 are disconnected from the powerline connections 30, 3a and 3b. When the electrically powered device A is powered on, either over a remote switch at its powerline (not shown) or by the main power switch 6 of the electrically powered device A, the identity sender 2 gets powered but not yet the core device 1. The identity sender 2 transmits identifier information of the electrically powered device A via the powerline connections 3a, 30 by modulating the identifier information onto the electrically powered device's total impedance with a switched additional impedance by switching on and off the modulating switch 2a and thus the impedance 2b.

After successfully transmitting the electrically powered device's identifier information, the identity sender 2 stops modulating the impedance and connects the core device 1 via powerline connection 3b and/or the powerline connections 30, 3a to the external power supply. The time needed for sending the identity information of the electrically powered device delays the start of operation of the core device 1 of the electrically powered device A. This time delay may be limited to a value that is acceptable for the typical use of the core device 1, for example, to a maximum of 2 seconds, preferably to a maximum of 1 second, in particular preferably to a maximum of 500 milliseconds. An identity receiver, in particular provided in a power supply device, receiving the modulated impedance on the powerline connection 30 may decode the transmitted identity information of the electrically powered device A by metering the power of the electrically powered device A at the powerline connection 30. The delayed powering on and off of the core device 1 avoids interference with the overall power supply to the electrically powered device. The time delay is determined according to the duration of a successful identification of the electrically powered device A with a power supply device B.

Figure 3:
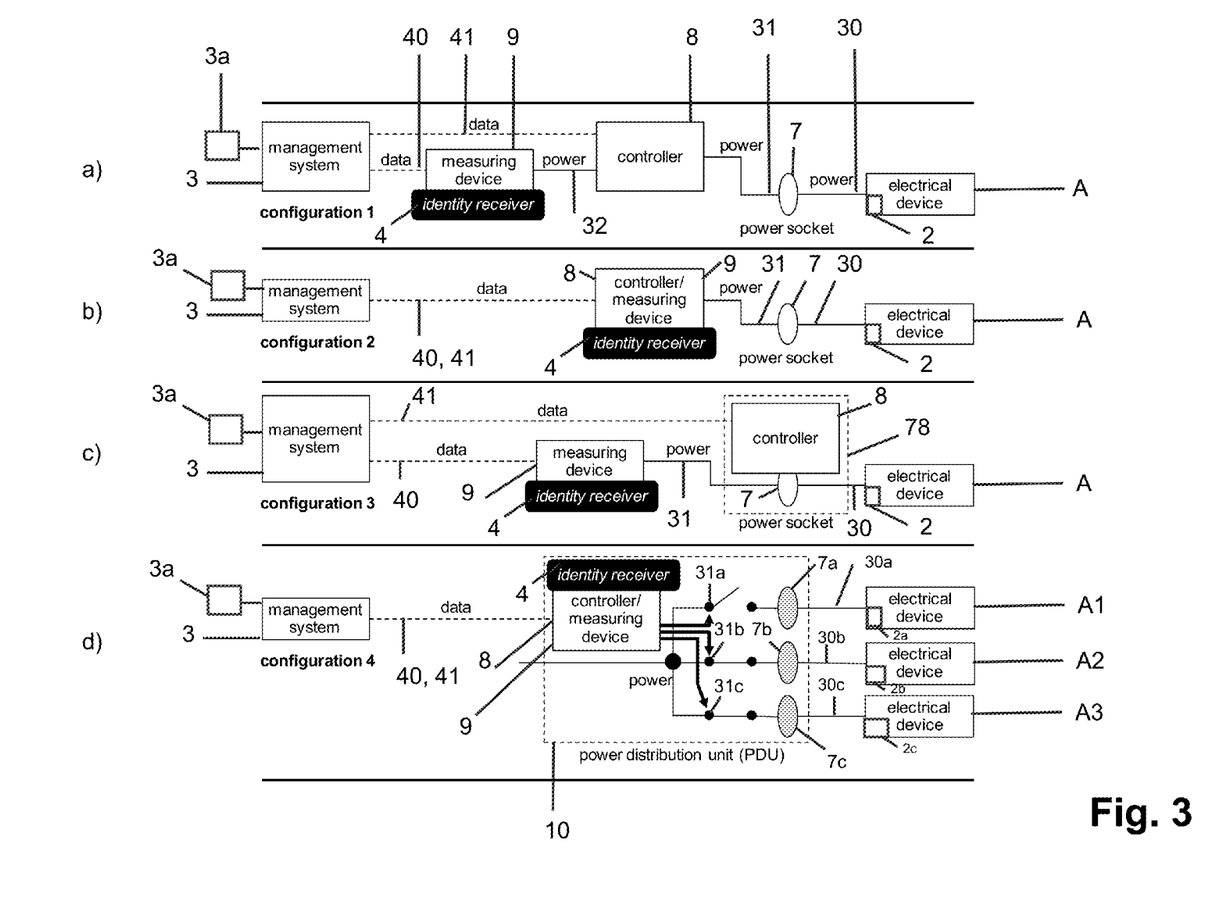
FIG. 3a-d are showing systems according to a third, fourth, fifth and sixth embodiment of the present invention.

FIG. 3a is showing a system according to a third embodiment of the present invention.

In FIG. 3a there is shown an electrically powered device A which is connected via powerline connection 30 to a power socket 7. The power socket 7 is connected via a powerline connection 31 to a controller 8. The controller 8 is connected via powerline connection 32 to a measuring device 9 and an identity receiver 4. The measuring device is connected via data connection 40 to a management system 3. The controller 8 is further connected via data connection 41 to the management system 3. The management system 3 is further connected to a database 3a. The electrically powered device A comprises also an identity sender 2.

When the controller 8 switches on the core power supply for the electrically powered device A by activating the power socket 7 by the powerline connection 31 the electrically powered device A gets powered via powerline connection 30. The electrical powering of the core device 1 of the electrically powered device A is delayed until the identity sender 2 has sent identification information of the electrically powered device A by imposing a specific load by modulation of the power of the powerline connection 30, 31 and 32. The identity receiver 4 is located upstream or behind the controller 8 but is located in the same electrical circuit, thus able to sense the imposed specific load according to a unique identifier of the electrically powered device A. The controller 8 does not require an identity receiver 4, because the management system 3 is able to transmit the association it has established between the measuring device 9 and the electrically powered device A to the controller 8, since the topology of the power circuit shown in FIG. 3a enables for a unique mapping.

The measuring device 9 is for example used for measuring the energy consumption of the electrically powered device A via powerline connections 32, 31 and 30. The management system 3 has stored the association established between the measuring device 9 and the electrically powered device A in the database 3a connected to the management system 3.

The management system 3 may actively retrieve or request the identification information from the identity receiver 4 (so called "pull"). Alternatively or additionally the identity receiver 4 may also transmit the identity information to the management system 3 ("push"), in particular when an identification process for an electrically powered device is completed.

FIG. 3b is showing a system according to a fourth embodiment of the present invention.

FIG. 3b is showing in general a corresponding system according to FIG. 3a. In contrast to FIG. 3a the controller 8 and the measuring device 9 are combined within a single device and further the identity receiver 4 is located on that single device. The association of both the controller 8 and the measuring device 9 with the electrically powered device A occurs in general simultaneously.

FIG. 3c is showing a system according to a fifth embodiment of the present invention.

In FIG. 3c there is shown in general a system according to FIG. 3a. In contrast to FIG. 3a the controller 8 in FIG. 3c is integrated with the power socket 7 in a combined device, denoted with reference sign 78. The identification of the electrically powered device A occurs again further upstream in the power circuit by the identity receiver 4 located at the measuring device 9. The association between the controller 8 and the electrically powered device A is according to FIG. 3a.

FIG. 3d is showing a system according to a sixth embodiment of the present invention.

In FIG. 3d three electrically powered devices A1, A2, A3 are shown which are each connected via a separate powerline connection 30a, 30b, 30c to corresponding power sockets 7a, 7b, 7c of a power distribution unit 10. The power distribution unit 10 is further connected via a data connection 40, 41 to the management system 3. The power distribution unit 10 comprises an identity receiver 4 as well as a controller 8 and a measuring device 9. The controller 8 and the measuring device 9 as well as the identity receiver 4 control switches 31a, 31b, 31c for the power sockets 7a, 7b, 7c for the power supply of the electrically powered devices A1, A2, A3. A powerline connection 31 supplying power is connected to the power switches 31a, 31b, 31c. When for example the electrically powered device A1 has to be supplied with electrical power the controller 8 of the power distribution unit 10 closes power switch 31a so that the electrically powered device A1 is connected to the powerline connection 31 for supplying power. The power distribution unit 10 enables therefore a connection of multiple, in particular 8 or 16 electrically powered devices to a same box. Such a power distribution unit 10 may hold measuring and control functions (controller 8 respectively measuring device 9) which can measure the energy consumption of each electrically powered device A1, A2, A3 and control each electrically powered device A1, A2, A3 for example turning it off individually. The identity receiver 4 in the power distribution unit 10 works independently for each power socket 7a, 7b, 7c of the power distribution unit 10.

Figure 4:
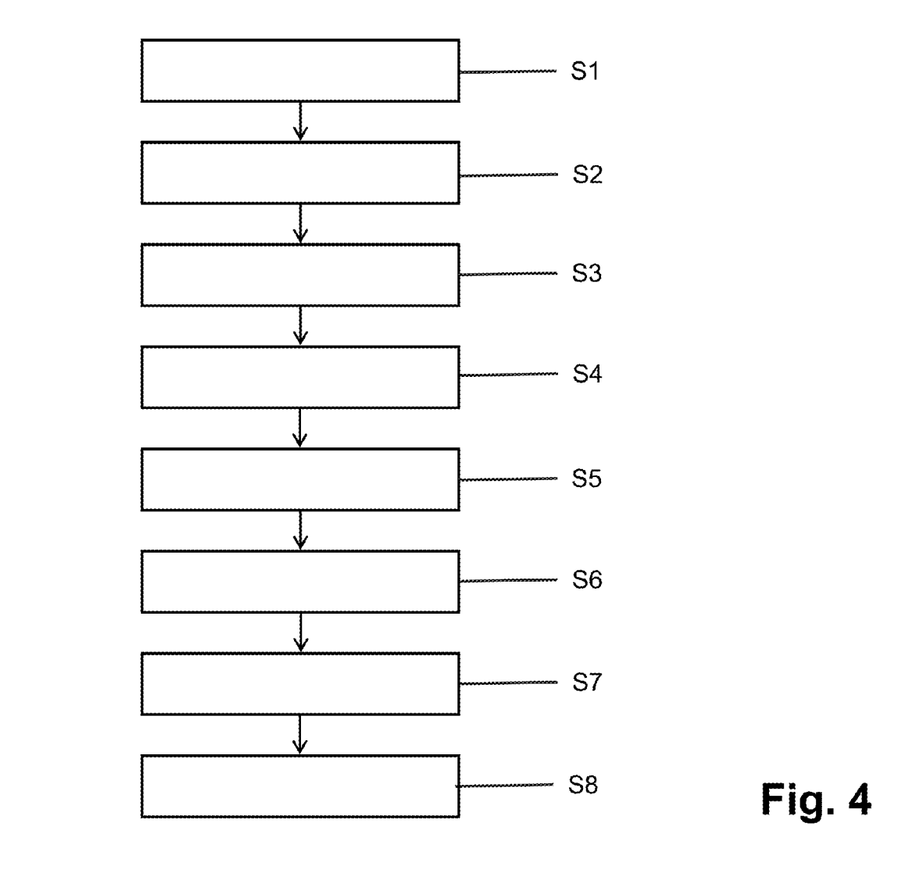
FIG. 4 is showing a method according to a seventh embodiment of the present invention.

FIG. 4 is showing a method according to a seventh embodiment of the present invention.

In FIG. 4 reference sign S1 denotes the step of plugging in an electrically powered device into a power socket.

Reference sign S2 denotes the step of detecting by the device that it has plugged in, which is possibly for example by an electrical circuitry in the electrically powered device that can sense the power available via a powerline connection, wherein at this point the electrically powered device is not turned on and defined to be in an initialization phase.

Reference sign S3 denotes the step of upon sensing power generating a specific load on the powerline by the device, wherein this is accomplished by the electrical circuitry in the electrically powered device and wherein this specific load encodes a unique identification information of the electrically powered device and wherein a suitable transmission protocol may be used to transmit the encoded identification, containing for example a preamble and a finalization sequence to be able to identify the beginning and the ending of the identification information and also any advantageous code may be used to optimize the conveyance of the identification information.

Reference S4 denotes the step of sensing the generated characteristic load of the electrically powered device by an identity receiver component, for example implemented in a power supply device, located in the power circuit to which the electrically powered device is connected and wherein the identity receiver is able to sense beginning and ending of the communicated identifier or identification information by an appropriate encoding and wherein the identity receiver then records the characteristic load and translates it into a digital representation after the ending.

Reference sign S5 denotes the step of completing the communication between the identity receiver and the electrically powered device wherein the electrically powered device goes into operational mode as soon as it has transmitted its identifier via the method according to the steps S1-S4.

Reference sign S6 denotes the step of sending a digital representation via a device containing the identity receiver component to an in particular energy management system. The required data connection between the identity receiver component and the management system in general exist, because the identity receiver is always located on a device which is a dedicated part of the management system and thus is to be connected to the management system in order to communicate for the purpose of measurement, control and/or other purposes.

Reference sign S7 denotes the step of receiving by the management system the digitally encoded identification information of the electrically powered device and is storing the digitally encoded identification information in a database. The identification information may be associated by the management system with any other information that is already available about the device, for instance, additional meta-information about the device, for example which may be downloaded from the internet of the manufacturer or the like, previous energy consumption recordings or previous control actions performed in the electrically powered device.

Reference sign S8 denotes the steps of establishing a relation between the device hosting the identity receiver component and the electrically powered device that was plugged in by the management system. This enables to uniquely identify which measurement device or controller may be used to measure or control the electrically powered device.

An identity receiver is in particular a supporting apparatus in a component, for example that is being able to measure the energy consumption of an electrically powered device for the purpose of detecting the device's specific consumption pattern created for identification of the electrically powered device.

In summary the invention provides an electrically powered device that may be automatically identified by a management system when the electrically powered device is connected to a powerline, wherein the electrically powered device creates an electrically load pattern according to a unique identifier for the electrically powered device in such a way that this electrically load pattern may be measured by a device to be associated with the electrically powered device and communicated to the management system by the associated device. The present invention also provides receiving of multiple identifications by the same identity receiver, either sequentially or simultaneously, the storing of identifiers and the reporting of measurements of the corresponding electrically powered devices in particular in form of some of multiple measurements of different electrically powered devices. When transmission protocol techniques are used the support of collisions in case of multiple identifier transmissions or in case of a transmission of an identifier while another electrically powered device is currently operating on the same powerline and a support of false identification detection in case of erroneous identifier transmission is also provided by the present invention.

For an identifier any form of suitable identifier schemes, such as simple identifiers that are locally unique, for example within the set of electrically powered devices connected to the same power distribution unit, to identifiers that are globally unique, for example identifiers that are equal to or based on Ethernet MAC addresses, IPv6 addresses or the like, may be used with the present invention.

The present invention also enables transmitting the identifier several times instead of just once. It is also possible to timeshift the signaling of an electrically powered devices identification to another point in time while the electrically powered device, respectively its core device, is in operation. The electrically powered device may also be managed, for example by a server through SNMP or similar protocols. Further, a coordinated detection of electrically powered devices may be run: the management system tells only one electrically powered device to run the process for identifying the electrically powered device and the measuring device would detect it and see where it is coming from. This process may be repeated for all electrically powered devices providing easier detection of each electrically powered device. If the electrically powered devices are managed a power consumption pattern may be created through the management system by using certain commands, for example run a process which consumes a lot of power, stop it and redo it, or by using a certain pattern of power consuming commands.

The present invention provides therefore an electrically powered device with a capability to put a unique load pattern on the powerline that can be identified by any device supporting with detection of such a pattern. The identification of an electrically powered device by a management system does not require a direct data connection to the management system but only a connection via the same power circuit to another device that has a data connection to the management system. Further, an association between devices whether in the path of the power circuit where the electrically powered device is plugged in may be provided.

One of the advantages of the present invention is, that identity senders and/or identity receivers are cheap and easy to implement in electrically powered devices. A further advantage of the present invention is a fast and reliable identification of electrically powered devices by an identity receiver and/or a management system without requiring the electrically powered device to have a direct data connection to the management system. The management system further provides an association of measurement and/or control devices with the electrically powered devices that are located in the same circuit. A further advantage is that the present invention may be used on both alternating current and direct current using a conventional powerline.

Many modifications and other embodiments of the invention set forth herein will come to mind the one skilled in the art to which the invention pertains having the benefit of the teachings presented in the foregoing description and the associated drawings. Therefore, it is to be understood that the invention is not to be limited to the specific embodiment disclosed and that modifications and other embodiments are intended to be included within the scope of the appended claims. Although specific terms are employed herein, they are used in a generic and descriptive sense only and not for purposes of limitation.

The invention claimed is:

1. A method for identifying at least one electrically powered device by a power supply device via a powerline connection, the method comprising: the steps of
   a) connecting the at least one electrically powered device via a powerline connection to a core power supply of the power supply device;
   b) sensing that the powerline connection is available by the at least one electrically powered device;
   c) generating a specific load by modulation of the power according to a unique identifier of the at least one electrically powered device on the powerline connection, the at least one electrically powered device being switched on for regular operation only after a complete transmission of the unique identifier;
   d) sensing the generated specific load by the power supply device connected to the powerline connection; and
   e) extracting the unique identifier information from the specific load by the power supply device; and
   h) measuring at least one specific characteristic of the at least one electrically powered device using the unique identifier information of the at least one electrically powered device.

2. The method according to claim 1, further comprising: the step of:
   f) registering the at least one electrically powered device with a device management system according to the extracted unique identifier information.

3. The method according to claim 2, wherein the device management system is connected to a database and stores the unique identifier information of the at least one electrically powered device in the database.

4. The method according to claim 2, further comprising: the step of:
   g) switching on the at least one electrically powered device for normal operation after at least step e).

5. The method according to claim 1, further comprising: the step of:
   g) switching on the at least one electrically powered device for normal operation after at least step e).

6. The method according to claim 5, wherein the time interval between step a) and step g) is not greater than 2 s.

7. The method according to claim 1, wherein additional information of the at least one electrically powered device is associated with the unique identifier information.

8. The method according to claim 1, wherein a measuring device is associated with the at least one electrically powered device.

9. The method according to claim 1, wherein a controller for at least controlling the power supply for the at least one electrically powered device via the powerline connection is associated to the electrically powered device.

10. The method according to claim 1, wherein at least for the step c) and step d) a transmission protocol is used, based on one or more of code division multiplexing, frequency division multiplexing, and correction codes.

11. The method according to claim 1, wherein one or more of error correction and false identification detection is used at least in step d) and step e).

12. The method according to claim 1, wherein the specific load is one or more of amplified and retransmitted.

13. The method according to claim 1, wherein at least one carrier signal is generated and superimposed on the powerline connection for transmission of additional information.

14. An electrically powered device for identifying with a power supply device, the electrically powered device comprising:
   a powerline socket configured t connect the electrically powered device via a powerline connection to a core power supply of the power supply device;
   a core device configured to perform an application of the electrically powered device; and an identity sender configured to send a unique identifier via the powerline connection, to sense an availability of a powerline connection, and to generate a specific load by modulation of the power according to a unique identifier of the electrically powered device, on the powerline connection, such that at least one specific characteristic of the at least one electrically powered device using the identifier information of the at least one electrically powered device is able to be measured, the identity sender being configured to control the power supply for the core device such that, only after completion of the transmission of the identity information, the core device is switched on for regular operation.

15. The electrically powered device according to claim 14, further comprising a main power switch to switch on and off one or more of the identity sender and the core device.

16. The electrically powered device according to claim 14, wherein the identity sender is configured to control the power supply for the core device.

17. The electrically powered device according to claim 14, wherein the identity sender is configured such that the specific load is generated by one or more of modulation of an impedance, a plurality of impedances, and a pulse width modulation for the power of the powerline connection.

18. The electrically powered device according to claim 14, wherein the identity sender is configured to extract information transmitted from by an identity receiver via the powerline connection.

19. A system for identifying at least one electrically powered device by a power supply device via a powerline connection, the system comprising:
the at least one electrically powered device according to claim 14;
at least one power supply device comprising a powerline socket configured to connect the power supply device to a powerline; and
an identity receiver configured to receive a unique identifier of the electrically powered device via the powerline connection the identity receiver being configured to sense a specific load generated by an identity sender of the electrically powered device on the powerline connection, the at least one electricity powered device being switched on for regular operation only after a complete transmission of the unique identifier, the unique identifier information being extracted from the sensed specific load; and
a measuring device configured to measure at least one specific characteristic of the at least one electrically powered device using the unique identifier information of the at least one electrically powered device,
wherein the at least one electrically powered device, the power supply device, and the measuring device are connected with each other via at least one powerline connection.

20. The system according to claim 19, further comprising at least one controller configured to control the power supply of the at least one electrically powered device, via the powerline connection.

21. The system according to claim 20, further comprising a power distribution unit comprising the measuring device, and the controller.

22. The system according to claim 19, further comprising a device management system with a database configured to store unique identifier information of the at least one electrically powered device in the database and/or to associate the at least one electrically powered device with the unique identifier information and/or to associate the measuring device with the at least one electrically powered device.

23. A power supply device for identifying an electrically powered device, the power supply device comprising:
a powerline socket configured to connect the power supply device to a powerline; and
an identity receiver configured to receive a unique identifier of the electrically powered device via the powerline connection, the identity receiver being configured
to sense a specific load generated by an identity sender of the electrically powered device on the powerline connection, the specific load being generated by modulation of the power according to the unique identifier of the at least one electrically powered device on the powerline connection, the at least one electrically powered device being switched on for regular operation only after a complete transmission of the unique identifier, and
to extract the unique identifier information from the sensed specific load such that at least one specific characteristic of the at least one electrically powered device using the unique identifier information of the at least one electrically powered device is able to be measured.

24. The power supply device according to claim 23, further comprising a confirmation sender configured to provide at least a confirmation signal for the electrically powered device, via the powerline connection.

25. The power supply device according to claim 23, wherein the identity receiver further comprises a measuring device configured to measure the at least one specific characteristic of the electrically powered device using the unique identifier information of the at least one electrically powered device.

26. The power supply device according to claim 23, further comprising a controller configured to control the core power supply for the electrically powered device via the powerline connection.

27. A power distribution unit, comprising:
a measuring device configured to measure at least one specific characteristic of at least one electrically powered device using the unique identifier information of the at least one electrically powered device;
a controller configured to control the power supply for the at least one electrically powered device via the powerline connection; and
the power supply device according to claim 23.

* * * * *